United States Patent
Chandrasekaran et al.

(10) Patent No.: US 10,361,698 B2
(45) Date of Patent: Jul. 23, 2019

(54) TRANSFORMER BASED GATE DRIVE CIRCUIT

(71) Applicant: Raytheon Company, Waltham, MA (US)

(72) Inventors: Sriram Chandrasekaran, Lucas, TX (US); Michael S. Hockema, Plano, TX (US)

(73) Assignee: Raytheon Company, Waltham, MA (US)

(*) Notice: Subject to any disclaimer, the term of this patent is extended or adjusted under 35 U.S.C. 154(b) by 56 days.

(21) Appl. No.: 15/413,166

(22) Filed: Jan. 23, 2017

(65) Prior Publication Data

US 2018/0241391 A1 Aug. 23, 2018

(51) Int. Cl.
*H03K 17/687* (2006.01)
*H03F 3/217* (2006.01)
(Continued)

(52) U.S. Cl.
CPC .......... *H03K 17/6871* (2013.01); *H02M 3/07* (2013.01); *H03F 3/2171* (2013.01);
(Continued)

(58) Field of Classification Search
CPC ............. H03K 17/687; H03K 17/6871; H03K 17/601; H03K 17/691
See application file for complete search history.

(56) References Cited

U.S. PATENT DOCUMENTS 8,884,657 B2 * 11/2014 Gan ..................... H03K 17/691
327/108
8,928,363 B2 * 1/2015 Hatanaka ............ H01L 27/0629
327/109
(Continued)

FOREIGN PATENT DOCUMENTS

CN 203135829 U 8/2013
JP 2013-150454 A 8/2013
WO WO 2016/159950 A1 10/2016

OTHER PUBLICATIONS

Cree, Inc., KIT8020-CRD-8FF1217-1 CREE MOSFET Evaluation Kit User's Manual, Oct. 31, 2014, 20 pages.
(Continued)

*Primary Examiner* — Hai L Nguyen

(57) ABSTRACT

A gate drive circuit for generating asymmetric drive voltages comprises a gate drive transformer comprising: a primary winding responsive to a pulse width module (PWM) input signal to generate a bipolar signal having a positive bias voltage and a negative bias voltage; and a secondary winding responsive to the bipolar signal to generate a PWM output signal. A first charge pump is connected to the secondary winding responsive to the PWM output signal to generate a level shifted PWM output signal. A second charge pump is connected to the secondary winding to generate a readjusted PWM output signal by decreasing at least a portion of the level shifted PWM output signal. A gate switching device is connected to the first charge pump and second charge pump. A level shifted PWM output signal
(Continued)

establishes an ON condition and the readjusted PWM output signal establishes an OFF condition of the gate MOSFET.

5 Claims, 7 Drawing Sheets

(51) Int. Cl.
| | | |
|---|---|---|
| *H03K 17/06* | (2006.01) | |
| *H03K 17/691* | (2006.01) | |
| *H02M 3/07* | (2006.01) | |
| *H03K 17/567* | (2006.01) | |
| *H01L 29/16* | (2006.01) | |

(52) U.S. Cl.
CPC ........... *H03K 17/06* (2013.01); *H03K 17/063* (2013.01); *H03K 17/567* (2013.01); *H03K 17/691* (2013.01); *H01L 29/1608* (2013.01); *H03K 2217/0081* (2013.01)

(56) References Cited

U.S. PATENT DOCUMENTS

| | | |
|---|---|---|
| 2007/0025123 A1 | 2/2007 | Kim et al. |
| 2014/0049297 A1 | 2/2014 | Nagai et al. |
| 2014/0367563 A1 | 12/2014 | Zhong et al. |

OTHER PUBLICATIONS

Balogh, Fundamentals of MOSFET and IGBT Gate Driver Circuits, Application Report, Mar. 2017, 48 pages, Texas Instruments Incorporated, Dallas, TX.

Invitation to Pay Additional Fees for International Application No. PCT/US2017/062879 dated Feb. 9, 2018, 13 pages.

International Search Report for International Application No. PCT/US2017/062879 dated Apr. 11, 2018, 23 pages.

* cited by examiner

TRANSFORMER BASED GATE DRIVE CIRCUIT

GOVERNMENT LICENSE RIGHTS

This invention was made with government support under Contract No. N00019-13-C-0128 awarded by the Department of Defense. The government has certain rights in the invention.

BACKGROUND

Modern power electronics often make use of metal oxide semiconductor field effect transistors (MOSFETs) and insulated gate bipolar transistors (IGBTs) in many applications. Power converters are comprised of a power circuit or topology consisting of power switching devices such as MOSFETs and IGBTs, control circuits that regulate the power conversion operation and gate drive circuits that serve as an interface between the two. Gate drive circuits are required to switch the MOSFETs and IGBT devices ON and OFF to control and condition the power conversion function. Gate drive circuits serve as the interface between the control circuitry and the power circuitry by conditioning and converting the Pulse Width Modulation (PWM) control signal to regulate the power conversion operation as required by the characteristics of the power switching device used in the power circuit.

All switching power converter topologies require one or more gate drive circuits depending on the number, type and electrical connection of the power switching devices used therein. MOSFET and IGBT type devices are controlled by applying a voltage between a control terminal, traditionally referred to as the "gate" and a reference terminal, traditionally referred to as the "source" or "emitter" respectively. A positive voltage at the gate with respect to source or emitter, would switch an N-channel MOSFET or IGBT ON, whereas a negative or zero voltage at the gate with respect to the source or emitter would switch the device OFF.

Gate drive circuits with magnetic transformers are commonly used to provide galvanic isolation between the control circuit and the power circuit. Transformer isolated circuits provide a robust, high speed, low loss and low cost implementation of the gate drive circuit for most switching devices. Transformers require a balanced volt-time product in the applied drive signal to prevent saturation. As a result, they are generally more readily applicable to power switching devices that can support a symmetric, bipolar gate drive voltage to control their ON/OFF behavior. Silicon based MOSFETs or IGBTs are able to support such a symmetric, bipolar drive voltage.

However, next generation devices such as Silicon Carbide (SiC) MOSFETs do not support a symmetric gate drive voltage. The SiC MOSFET, for example, requires, at its gate terminal, 20V to be switched ON and −5V to be switched OFF. Transformer isolated circuits used in combination with DC blocking capacitors can be used with limited success but cannot generate controlled voltage levels for turn-ON and turn-OFF independent of operating duty cycle without compromising volt-time product of the transformer. To overcome this limitation, implementations of gate drive circuits using auxiliary voltage sources to generate the turn-ON and turn-OFF voltage levels, which are high in component count, cost and low in efficiency are used.

BRIEF DESCRIPTION OF THE DRAWINGS

Features and advantages of the invention will be apparent from the detailed description which follows, taken in conjunction with the accompanying drawings, which together illustrate, by way of example, features of the invention; and, wherein.

Figure 1:
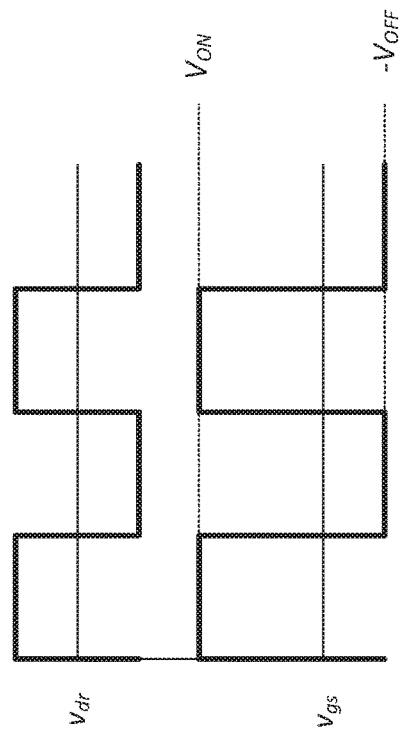
FIG. 1 is block diagram of a gate drive circuit in accordance with an example of the present disclosure.
Figure 1:
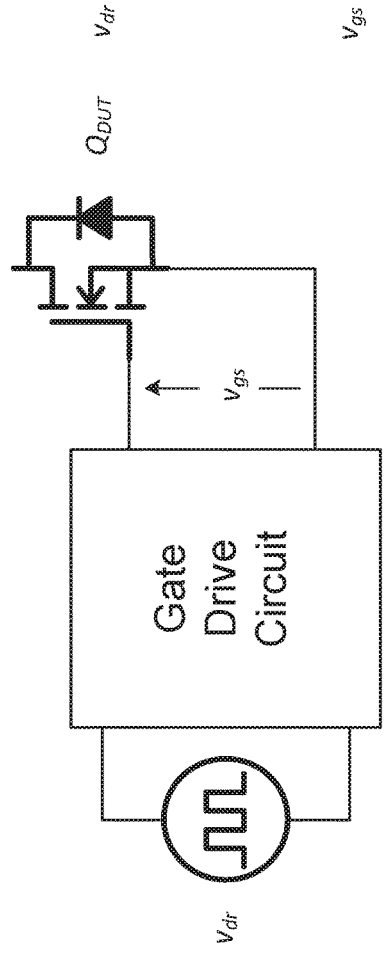

Reference will now be made to the exemplary embodiments illustrated, and specific language will be used herein to describe the same. It will nevertheless be understood that no limitation of the scope of the invention is thereby intended.

DETAILED DESCRIPTION

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result.

As used herein, "adjacent" refers to the proximity of two structures or elements. Particularly, elements that are identified as being "adjacent" may be either be abutting or connected. Such elements may also be near or close to each other without necessarily contacting each other. The exact degree of proximity may in some cases depend on the specific context.

An initial overview of technology embodiments is provided below and then specific technology embodiments are described in further detail later. This initial summary is intended to aid readers in understanding the technology more quickly but is not intended to identify key features or essential features of the technology nor is it intended to limit the scope of the claimed subject matter.

As mentioned, power converters have been widely used to provide regulated power supplies. In one aspect, power switching devices used in power converter topologies, may either use a transformer based gate drive circuit, isolated power supplies, and/or level shifters to create the necessary drive voltages to turn the power switching devices on and off. However, gate drive circuits, such as floating gate drive circuits, using isolated power supplies or level shifters are high in component-count, limited in their frequency of operation and are not as efficient as a transformer based gate drive circuit.

In one aspect, in order to achieve high-speed speed gate drive circuitry, switch frequencies (e.g., 200-250 kilohertz) and eliminate isolated bias power supplies, the present technology provides for a transformer based gate drive circuit. A transformer based gate drive circuit can be compact, robust, and enable high switching frequency. Transformers are inherently symmetrical devices driven by equal voltage-time product in both the positive and the negative directions. As such, a transformer based gate drive circuit cannot provide asymmetric drive voltages due to the need to maintain balanced volt-time product in the transformer. Hence, a shortcoming of this scheme is that the same magnitude of the voltage-time product is needed to drive the gates in the negative direction as well as the positive direction.

Accordingly, the present technology provides for an enhanced transformer based gate drive circuit to generate asymmetric gate drive voltages to turn-on and turn-off a gate switching device (e.g., an electrical switch), such as MOSFETs and IGBTs, independent of duty cycle without compromising the voltage-time product of the transformer The transformer based gate drive circuit can be efficient, compact, and robust and can require minimal peripheral circuitry to meet switching requirements of the power device used. In one aspect, the transformer based gate drive circuit can comprise a transformer having a primary winding and one or more secondary windings to generate the turn-on and turn-off voltages to drive the gate of the switching device. Charge pumps can be coupled to the one or more tapped secondary windings of the transformer to generate asymmetric gate drive voltages to turn-on and turn-off gate switching devices (e.g., MOSFETs and IGBTs). Thus, any need for auxiliary bias circuits for the turn-on and turn-off voltage levels can be eliminated. In an additional aspect, the transformer based gate drive circuit can provide a primary winding and a single secondary winding and two charge pumps.

The present technology provides various embodiments of transformer based gate drive circuits for a power switching device. In one aspect, the various embodiments of gate drive circuits achieve galvanic isolation using one or more transformer windings and generate asymmetric turn-on and turn-off voltage levels at the gate of the switching device without the need for external isolated bias voltage sources. The switching device may be a metal oxide semiconductor field effect transistors (MOSFET) and/or an insulated gate bipolar transistors (IGBTs). As used herein, each of the representative switching devices may be either the MOSFET and/or an insulated gate bipolar transistors (IGBTs) and discussions herein pertaining the MOSFET may also apply to IGBT and visa versa.

In one aspect, gate drive circuit for generating asymmetric drive voltages is provided. The gate drive circuit comprises a gate drive transformer that may include a primary winding responsive to a pulse width modulated (PWM) input signal to generate a bipolar signal having a positive and negative voltage levels; and a secondary winding responsive to the bipolar signal to generate a PWM output signal. The gate drive circuit may include a first charge pump electrically connected to the secondary winding responsive to the PWM output signal to generate a level-shifted PWM output signal. The gate drive circuit may include a second charge pump electrically connected to the secondary winding to generate a readjusted PWM output signal by decreasing at least a portion of the level-shifted PWM output signal. The gate drive circuit may include a MOSFET transistor having a source, a drain, and a gate, wherein the MOSFET transistor is electrically connected to the first charge pump and the second charge pump, wherein the level-shifted PWM output signal establishes an ON condition and the readjusted PWM output signal establishes an OFF condition of the MOSFET. The aspect of gate drive circuit presented can be used in a variety of power converter topologies including but not limited to DC/DC, DC/AC and AC/DC converters. The functional characteristics of the circuit are valid under fixed or variable duty cycle conditions. For example, the provided circuit can be used in isolated Zero Voltage Switching (ZVS) Phase Shifted Full Bridge type DC/DC converters where the operating duty cycle of the switching devices is always set to 50%. It is equally applicable to isolated and non-isolated DC/DC converters such as Flyback, buck and boost converters where the switch duty cycle can be different from 50%. It is also applicable in DC/AC inverters or AC/DC rectifiers where the duty cycle varies as a function of the waveshape of the output or the input voltage waveform. Additional embodiments and variations of the gate driver circuit are further described herein.

FIG. 1 is block diagram of a gate drive circuit in accordance with an example of the present disclosure. More specifically, FIG. 1 depicts A) a schematic of a gate drive circuit and B) a waveform of the gate drive circuit. The power device to be switched on and off is designated as $Q_{DUT}$. $V_{ON}$ represents the voltage required at the gate to turn the device on while $-V_{OFF}$ is the turn-off voltage. $v_{dr}$ represents the input to the gate drive circuit and $v_{gs}$ may be the output voltage of the gate drive circuit and the input voltage applied to the gate of $Q_{DUT}$ for the required turn-on and turn-off levels. In one aspect, the specifications of $Q_{DUT}$ may indicate the voltage level required for turn-on is $V_{ON}$ and the voltage required for turn-off is $-V_{OFF}$. In one aspect, the gate drive circuits as described herein may use a combination of transformer windings with varying turns-ratios and charge pumps to synthesize the turn-on and turn-off voltage levels at the gate of the switching device.

Figure 2A:
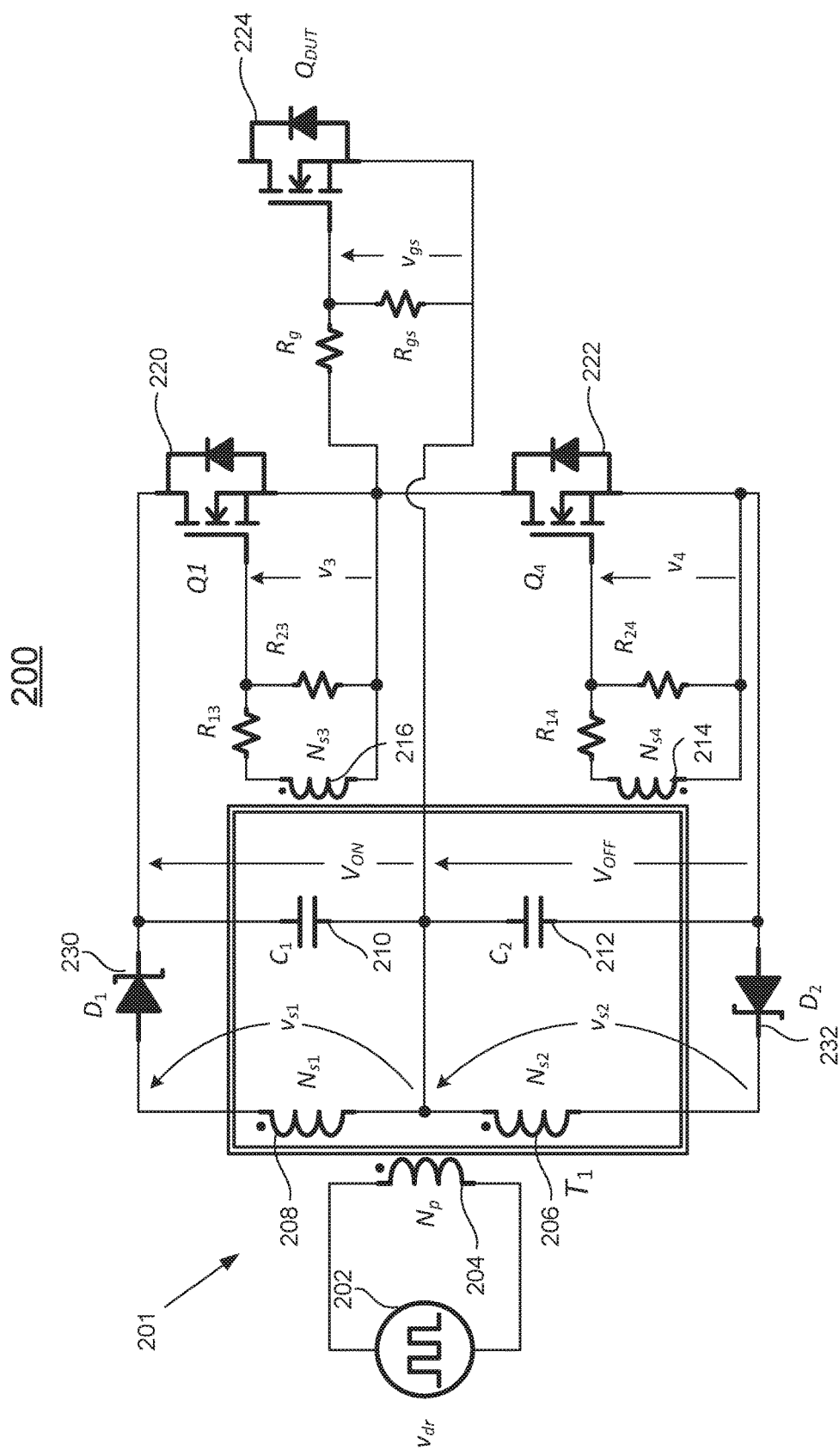
FIG. 2A is an example schematic illustration of a transformer based gate drive circuit with additional secondary windings in accordance with an example of the present disclosure.
Figure 2B:
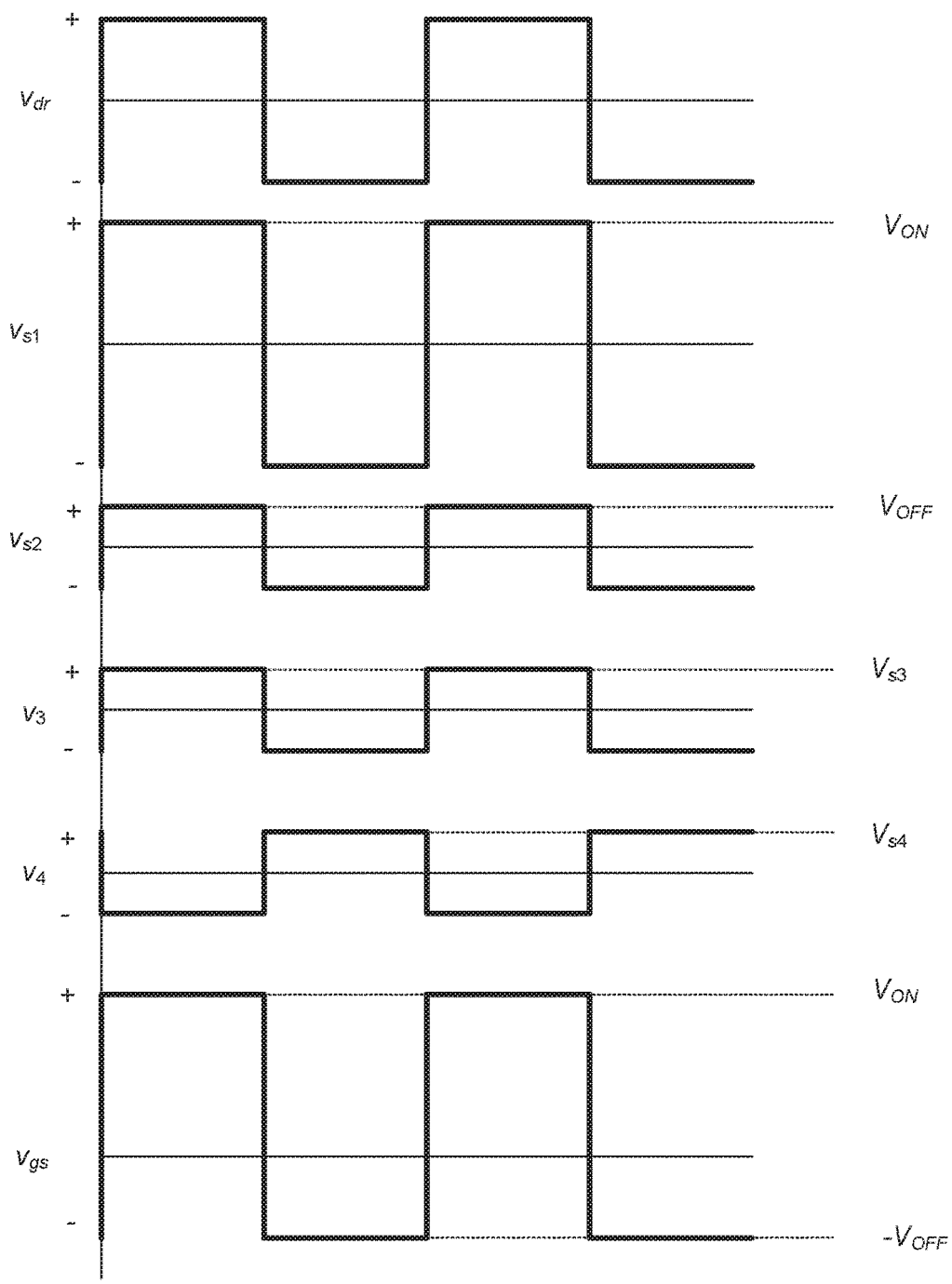
FIG. 2B is an example illustration of various waveforms for the transformer based gate drive circuit of FIG. 2A.

Turning now to FIG. 2A, an example schematic illustration of a transformer based gate drive circuit with additional secondary windings is depicted. FIG. 2B is an example illustration of various waveforms for the transformer based gate drive circuit of FIG. 2A. The transformer based gate drive circuit 200 can include a gate drive transformer 201 comprising a primary winding 204 responsive to a pulse width modulated (PWM) signal 202 (which may be an input signal). In one aspect, the PWM input signal is a bipolar square wave, such as, for example, a symmetric bipolar square wave voltage. The gate drive transformer 201 can include a first secondary winding 208 and a second secondary winding 206 responsive to a PWM signal 202 (which has now become a PWM output signal) of the primary winding 204. The first secondary winding 208 can include a first turn ratio different than a second turn ratio of the second secondary winding 206. The first secondary winding 208 can produce a first bias voltage ($V_{ON}$) and the second secondary winding 206 can produce a second bias voltage ($V_{OFF}$). In one aspect, a capacitor 210 and a diode 230 can be electrically connected to the first secondary winding 208. The capacitor 210 and diode 230 can be in series and/or in parallel to the first secondary winding 208 ($N_{s1}$). In one aspect, a capacitor 212 and a diode 232 can be electrically connected to the second secondary winding 206 ($N_{s2}$).

In one aspect, the gate drive transformer 201 can include additional windings 214, 216. The first additional winding 216 can be electrically coupled to the first secondary winding 208. The second additional winding 214 can be electrically coupled to the second secondary winding 206. The first additional winding 216 can be responsive to the first bias voltage ($V_{ON}$). The second additional winding 214 can be responsive to the second bias voltage ($V_{OFF}$) or ($-V_{OFF}$). In one aspect, the first bias voltage ($V_{ON}$) produced from the first additional winding 216 can be a turn ON voltage, such as, for example a turn ON voltage that is at least twenty (20) volts. In an additional aspect, the second bias voltage ($V_{OFF}$) produced from the second additional winding 214 can be a turn OFF voltage, such as, for example a turn OFF voltage that is at negative five (−5) volts.

A first drive MOSFET transistor 220 can be electrically coupled to the first additional winding 216 and responsive to the first bias voltage ($V_{ON}$). A second drive MOSFET transistor 222 can be electrically coupled to the second additional winding 214 and responsive to the second bias voltage ($V_{OFF}$). Also, the first additional winding 216 may be electrically connected to both resistors $R_{13}$ and $R_{23}$. The second additional winding 214 may be electrically connected to both resistors $R_{14}$ and $R_{24}$.

In one aspect, the transformer based gate drive circuit 200 can also include a switching device 224 (e.g., a MOSFET transistor 224 or a IGBT, hereinafter "MOSFET transistor 224" for illustrative convenience) that can be electrically coupled to first drive MOSFET transistor 220 and the second drive MOSFET transistor 222. In one aspect, the first bias voltage ($V_{ON}$) from the first drive MOSFET transistor 220 can drive the MOSFET transistor 224 to turn it ON. In one aspect, the second bias voltage $V_{OFF}$ from the second drive MOSFET transistor 222 can drive the MOSFET transistor 224 to turn it OFF. Furthermore, the MOSFET 224 can be a silicon carbide MOSFET. MOSFET transistor 224 may be electrically connected to both resistors $R_g$ and $R_{gs}$.

The power device required to be switched ON and OFF is $Q_{DUT}$. Per the specifications of $Q_{DUT}$, the voltage level required for turn-on is $V_{ON}$ and the voltage required for turn-off is $-V_{OFF}$ (see FIG. 1). More specifically, as depicted in FIGS. 2A and 2B, the input to the gate drive circuit may be represented by the voltage source $v_{dr}$. As shown in FIG. 2B, $v_{dr}$ may be a symmetric bipolar voltage applied to the primary winding $N_p$, 204 of the isolation transformer, $T_1$. Transformer $T_1$ may consists of 5 windings (204, 206, 208, 214, and 216), 1 primary winding with $N_p$ 204 turns and 4 secondary windings with turns $N_{s1}$, $N_{s2}$, $N_{s3}$ and $N_{s4}$ (206, 208, 214, and 216) as shown in FIG. 2A. Diode $D_1$ 230, capacitor $C_1$ 210, and diode $D_2$ 232, and capacitor $C_2$ 212 are charge pumps that rectify the secondary voltages $v_{s1}$ and $v_{s2}$ and generate the turn-on and turn-off bias voltages $V_{ON}$ and $V_{OFF}$ respectively. $Q_1$ 220 and $Q_4$ 222 are MOSFETs or functionally equivalent devices that apply voltages $V_{ON}$ and $V_{OFF}$ to the gate terminal of $Q_{DUT}$ to respectively turn-on and turn-off the device.

Voltages $v_{s1}$ and $v_{s2}$ generated across the secondary windings of the transformer $T_1$ are rectified by diodes $D_1$ 230 and $D_2$ 232 respectively, which are given by Equation 1:

$$v_{s1,2} = \frac{N_{s1,2}}{N_p} v_{dr} \quad (1)$$

Charge pump capacitors C1 210 and C2 212 charge to the peaks of the square wave voltages $v_{s1}$ and $v_{s2}$, respectively, to generate voltages $V_{ON}$ and $V_{OFF}$. $V_{ON}$ is the voltage level required to turn $Q_{DUT}$ on and $V_{OFF}$ is that required to turn $Q_{DUT}$ off.

The turn-on and turn-off voltages (with the various wave forms illustrating positive (+) and negative (−) voltages in FIG. 2B) are applied across the gate and source terminals of $Q_{DUT}$ via the MOSFETs $Q_3$ 220 and $Q_4$ 222. Voltages $v_3$ and $v_4$ are generated from $v_{dr}$ according to Equation 2.

$$v_{3,4} = \frac{N_{s3,4}}{N_p} v_{dr} \quad (2)$$

Secondary windings $N_{s3}$ 216 and $N_{s4}$ 214 are wound in opposing directions to each other such that voltage $v_3$ is in phase with $v_{dr}$ while $v_4$ is 180° out of phase with $v_{dr}$. As a result, MOSFETs Q3 220 and Q4 222, which have voltages $v_3$ and $v_4$ applied to their gates are switched complementary to each other, MOSFET $Q_3$ 220 is turned on to apply $V_{ON}$ to the gate of $Q_{DUT}$ while MOSFET $Q_4$ 222 is turned on to apply $-V_{OFF}$ to the gate of $Q_{DUT}$. The voltage $v_{gs}$ applied to the gate of the $Q_{DUT}$ 224 is in phase with $v_{dr}$. When $v_{dr}$ is asserted to turn on $Q_{DUT}$ $v_{gs}$ is equal to $V_{ON}$ and when $v_{dr}$ is de-asserted to turn off $Q_{DUT}$ $v_{gs}$ is equal to $-V_{OFF}$. It is noted that no specific order is required in the methods disclosed herein, though generally in some embodiments, method steps can be carried out sequentially.

Figure 3A:
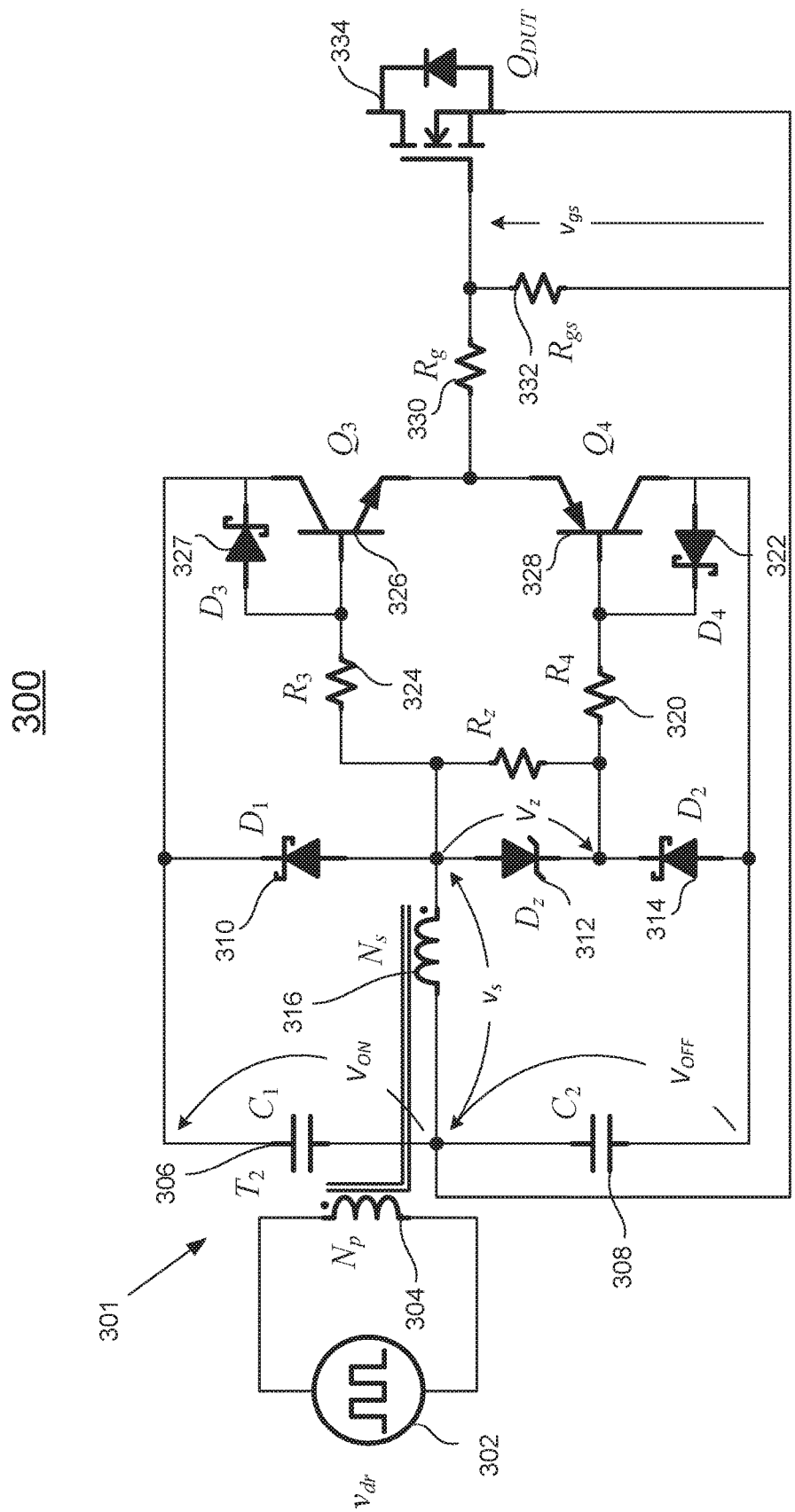
FIG. 3A is an example schematic illustration of a transformer based gate drive circuit with charge pumps in accordance with an example of the present disclosure.
Figure 3B:
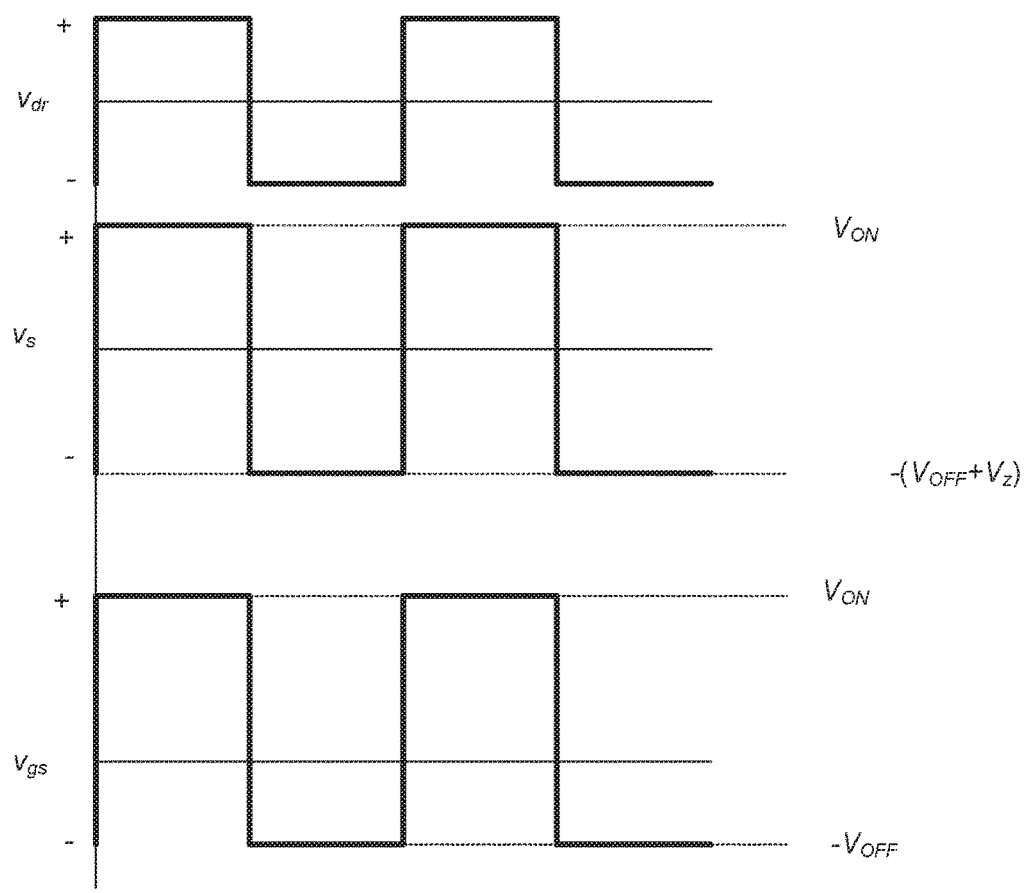
FIG. 3B is an example illustration of various waveforms for the transformer based gate drive circuit of FIG. 3A.

FIG. 3A is an example schematic illustration of a transformer based gate drive circuit 300 with charge pumps for generating asymmetric drive voltages. FIG. 3B is an example illustration of various waveforms 350 for the transformer based gate drive circuit of FIG. 3A.

In one aspect, transformer based gate drive circuit 300 can include at least one gate drive transformer 301. The gate drive transformer 301 can include a primary winding 304 ($N_p$) responsive to a pulse width modulated (PWM) signal 302 (e.g., voltage source $v_{dr}$) to generate a bipolar signal having a positive bias voltage (e.g., first bias voltage ($V_{ON}$)) and a negative bias voltage (e.g., second bias voltage ($V_{OFF}$)). The PWM signal 302 can be a symmetric bipolar square wave voltage. The positive bias voltage (e.g., first bias voltage $V_{ON}$)) and the negative bias voltage (e.g., second bias voltage $V_{OFF}$) can have a voltage range from positive thirteen (13) volts to negative thirteen (−13) volts.

The gate drive transformer 301 can also include a secondary winding 316 $N_s$ responsive to the bipolar signal to generate a PWM output signal. The PWM output signal can include the positive bias voltage and the negative bias voltage.

In one aspect, the transformer based gate drive circuit 300 can include a first charge pump electrically connected to the secondary winding 316 and responsive to the PWM output signal to generate a level shifted PWM output signal (e.g., an increased PWM output signal). The first charge pump can include capacitor ($C_1$) 306 and diode ($D_1$) ($D_1$) 310. The transformer based gate drive circuit 300 can also include a second charge pump electrically connected to the secondary winding 316 to generate a readjusted PWM output signal by decreasing at least a portion of the increased PWM output signal. The second charge pump can include capacitor $C_2$ 308 and diode $D_z$ ($D_z$) 312, which can be a zener diode. The diode $D_z$ 312 may be electrically connected to resistor $R_z$. The level shifted PWM output signal and the readjusted PWM output signal can be bipolar square wave voltages. The level shifted PWM output signal can have a voltage range from positive twenty six (26) volts to zero (0) volts. The readjusted PWM output signal can have a voltage range from positive twenty (20) volts to negative six (−6) volts.

The transformer based gate drive circuit 300 can also include first bipolar junction transistor (BJT) $Q_3$ 326 electrically connected to the first charge pump (collectively capacitor $C_1$ 306 and diode $D_1$ 310). The transformer based gate drive circuit 300 can also include a second BJT $Q_4$ 328 that can be electrically connected to the second charge pump (collectively diode $D_2$ 314, capacitor $C_2$ 308, zener diode $D_z$ 312). In one aspect, the zener diode $D_z$ 312 can control an amount of the level shifted PWM output signal to be decreased in order to generate the readjusted PWM output signal.

The first BJT $Q_3$ 326 and the second BJT $Q_4$ 328 can also be electrically connected to a gate switching device 324 (e.g., a gate MOSFET transistor or a IGBT, hereinafter "gate MOSFET transistor 324" for illustrative and descriptive convenience). The first BJT $Q_3$ 326 and the second BJT $Q_4$ 328 can each include a collector and a base. The collector of the first BJT $Q_3$ can be connected to a base of the first BJT using a first resistor $R_3$ 324 connected to the first charge pump (collectively capacitor $C_1$ 306 and diode $D_1$ 310). A collector of the second BJT $Q_4$ 328 can be connected to a base of the second BJT $Q_4$ 328 using a second resistor $(R_4)(R_4)$ 320 connected to the second charge pump (collectively diode $D_2$ 314, capacitor $C_2$ 308, zener diode $D_z$ 312).

The gate MOSFET transistor 334 can have a source, a drain, and a gate. In one aspect, the first BJT $Q_3$ 326 can drive the level shifted PWM output signal into a gate of the MOSFET $Q_{DU}$ 334. The second BJT $Q_4$ 328 can also be electrically connected to the MOSFET $Q_{DU}$ 334. The second BJT $Q_4$ 328 can drive the readjusted PWM output signal into the gate of the MOSFET $Q_{DU}$ 334. The MOSFET transistor $Q_{DUT}$ 334 can have a source, a drain, and a gate. The MOSFET transistor $Q_{DUT}$ 334 may also be connected to resistor $R_9$ 330 and resistor $R_{gs}$ 332.

The level shifted (e.g., increased) PWM output signal driven from the first BJT $Q_3$ 326 to the gate MOSFET $Q_{DUT}$ 334 can establish an ON condition. The readjusted PWM output signal driven from the second BJT $Q_4$ 328 to the MOSFET $Q_{DUT}$ 334 can establish an OFF condition of the MOSFET $Q_{DUT}$ 334. The MOSFET $Q_{DUT}$ 334 can be a silicon carbide MOSFET More specifically, the PWM input signal 302 to the gate drive circuit 300 can be represented by the voltage source $v_{dr}$. As shoal in FIG. 3B, voltage source $v_{dr}$ may be a symmetric bipolar voltage applied to the primary winding $N_p$ of the isolation transformer, $T_2$. Transformer $T_2$ consists of 2 windings (304, 316), 1 primary winding 304 with $N_p$ turns and one secondary winding 316 with $N_s$ turns as shown in FIG. 3A. A charge pump formed by diode $D_1$ 310 and capacitor $C_1$ 306 rectifies the secondary voltage and generates the turn-on voltage $V_{ON}$ (with the various wave forms illustrating positive (+) and negative (−) voltages in FIG. 3B). The turn-off voltage $V_{OFF}$ is generated by the charge pump diode $D_2$ 314, capacitor $C_2$ 308, zener diode $D_z$ 312. The secondary voltage $V_s$ on the negative half cycle may reduced by the zener voltage $V_z$ to generate the turn-off voltage ($V_{OFF}$) across capacitor $C_2$. BJT $Q_3$ 226, diode $D_3$ 327, resistor $R_3$ 324 and BJT $Q_4$ 328, diode $D_4$ 322, and resistor $R_4$ form a complementary source follower to drive the required current into the gate of $Q_{DUT}$. Neglecting diode forward voltage drops, the voltage $v_{gs}$ applied to the gate of $Q_{DUT}$ (e.g., MOSFET 334) has the required turn-on and turn-off levels.

Figure 4A:
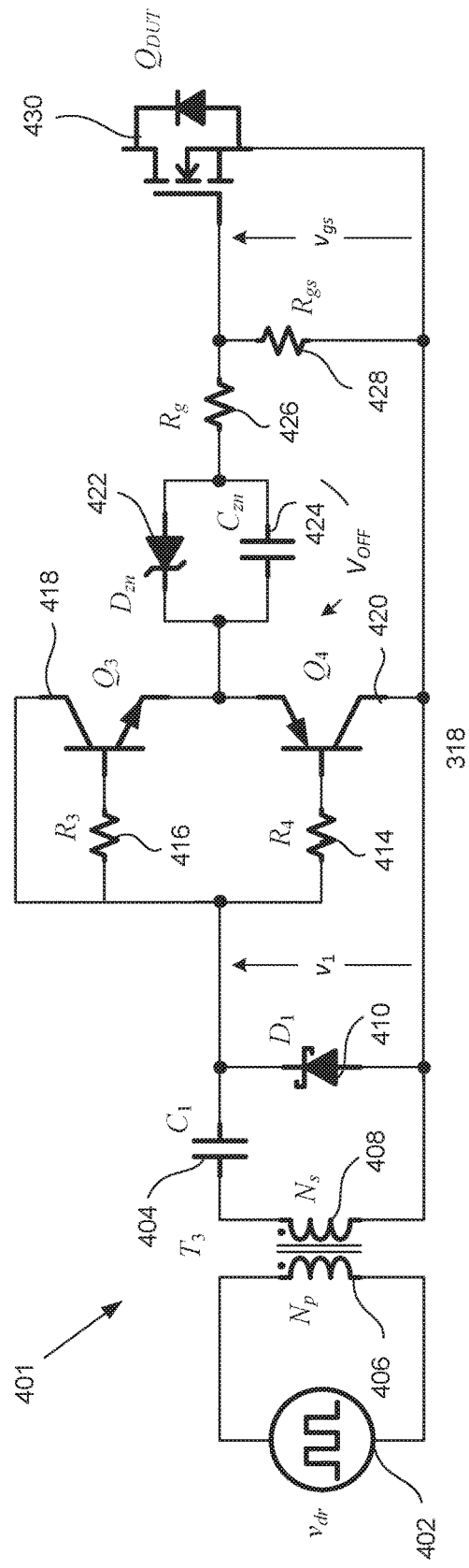
FIG. 4A is an additional example schematic illustration of a transformer based gate drive circuit with charge pumps in accordance with an example of the present disclosure.
Figure 4B:
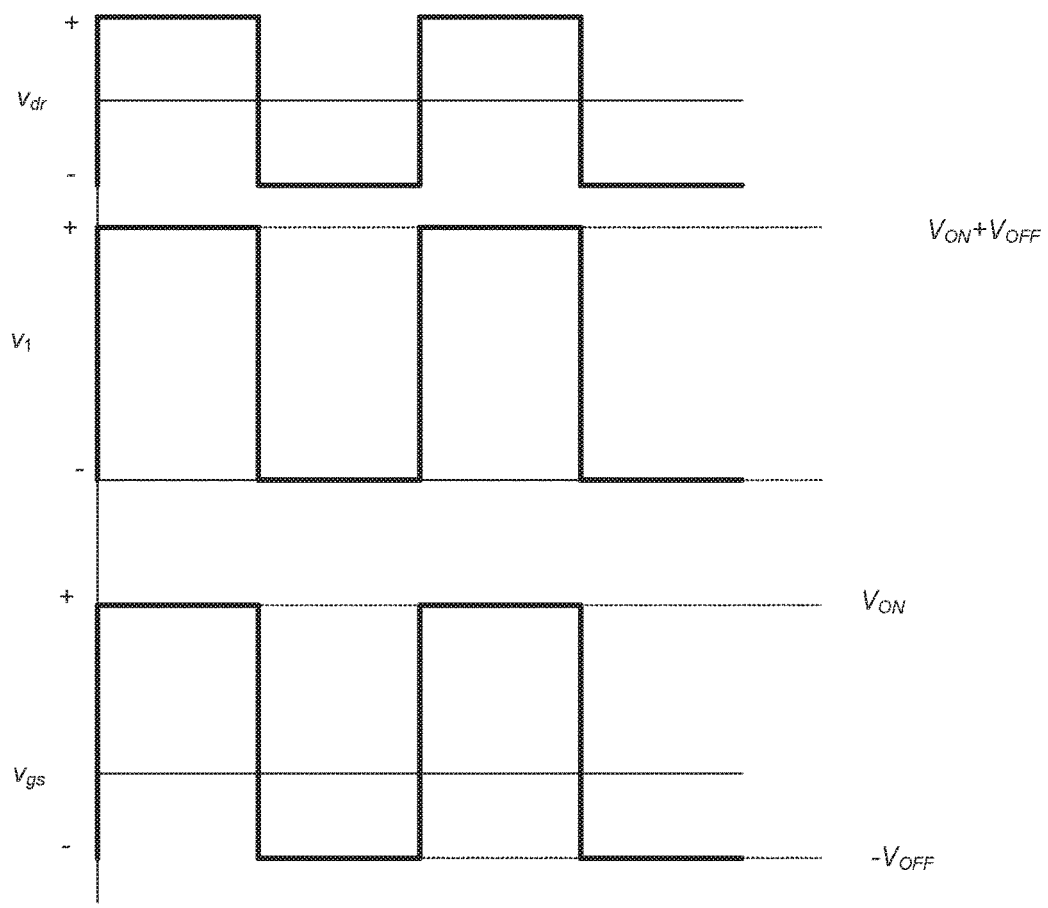
FIG. 4B is a schematic illustration of various waveforms for the transformer based gate drive circuit of FIG. 4A.

FIG. 4A is an additional example schematic illustration of a transformer based gate drive circuit 400 with charge pumps for generating asymmetric drive voltages. FIG. 4B is an example illustration of various waveforms 450 for the transformer based gate drive circuit of FIG. 4A.

The transformer based gate drive circuit 400 can include gate drive transformer 401 that can include a primary winding ($N_p$) 406 responsive to a pulse width module (PWM) signal 402 (e.g., voltage source $v_{dr}$ to generate a bipolar signal having a positive bias voltage and a negative bias voltage. The positive bias voltage can be asymmetric to the negative bias voltage. The positive bias voltage and the negative bias voltage can have a voltage range from positive thirteen (13) volts to negative thirteen (−13) volts. The transformer based gate drive circuit 400 can comprise a single secondary winding $N_s$ 408 responsive to the bipolar signal to generate a PWM output signal. The PWM signal (e.g., PWM output signal) can include the positive bias voltage and the negative bias voltage In one aspect, the transformer based gate drive circuit 400 can include a first charge pump electrically connected to the secondary winding 408 and responsive to the PWM output signal to generate a level shifted PWM output signal (e.g., an increased PWM output signal). The first charge pump can include capacitor $C_1$ 404 and diode $D_1$ 410. In one aspect, the capacitor $C_1$ 404 and diode $D_1$ 410 can be in series and/or in parallel to the secondary winding 408.

The transformer based gate drive circuit 400 can include a first bipolar junction transistor (BJT) 418 (e.g. $Q_3$) and a second BJT 420 (e.g., $Q_4$) electrically connected to the first charge pump (collectively the capacitor $C_1$ 404 and diode $D_1$ 410) to drive the level shifted PWM output signal. The first BJT $Q_3$ 418 and the second BJT $Q_4$ 420 can each include a collector and a base. The collector of the first BJT $Q_3$ 418 can be connected to a base of the first BJT 418 using a first resistor $R_3$ 416 that can be connected to the first charge pump (collectively capacitor $C_1$ 404 and diode $D_1$ 410). A collector of the second BJT $Q_4$ 420 can be connected to a base of the second BJT $Q_4$ 420 using a second resistor $R_4$ 414 that is connected to the first charge pump (collectively capacitor $C_1$ ($C_1$) 404 and diode $D_1$ ($D_1$) 410). A diode can be substituted for BJT $Q_3$ 418 and resistor $R_3$ 416 by connecting the anode to the first charge pump (collectively capacitor $C_1$ 404 and diode D1 410) and the cathode to the emitter of BJT $Q_4$ 420. This can result in reducing the physical size of the circuit. The first BJT $Q_3$ 418 and the second BJT $Q_4$ 420 can also be electrically connected to a second charge pump (collectively capacitor $C_{zn}$ 424 and diode $D_{zn}$ 422) in the transformer based gate drive circuit 400. Resistor $R_g$ 426 and resistor $R_{gs}$ 428 may also be electrically connected to MOSFET 430 and capacitor $C_{zn}$ 424 and diode $D_{zn}$ 422. That is, MOSFET $Q_{DUT}$ 430 may be gate switching device (e.g., a gate MOSFET transistor or a IGBT, hereinafter "MOSFET 430" for illustrative and descriptive convenience).

The second charge pump (collectively capacitor $C_{zn}$ 424 and diode $D_{zn}$ 422) can be electrically connected to first BJT 418 and the second BJT 420 to generate a readjusted PWM output signal by decreasing at least a portion of the level shifted PWM output signal. The second charge pump can include capacitor $C_{zn}$ 424 and diode $D_{zn}$ 422, which can be a zener diode.

In one aspect, the level shifted PWM output signal can have a voltage range from positive twenty six (26) volts to zero (0) volts. The readjusted PWM output signal can have a voltage range from positive twenty (20) volts to negative six (−6) volts.

The transformer based gate drive circuit 400 can include a gate MOSFET transistor $Q_{DUT}$ 430 having a source, a drain, and a gate. The gate MOSFET transistor $Q_{DUT}$ 430 can be electrically connected to the second charge pump (collectively capacitor $C_{zn}$ 424 and diode $D_{zn}$ 422). The readjusted PWM output signal at the gate MOSFET transistor $Q_{DUT}$ 430 can establish an ON condition of the gate MOSFET transistor $Q_{DUT}$ 430 and/or the readjusted PWM output signal at the gate MOSFET transistor $Q_{DUT}$ 430 can establish an OFF condition of the gate MOSFET transistor $Q_{DUT}$ 430.

The input to the gate drive circuit is represented by the voltage source $v_{dr}$. As shown in FIG. 4B, $v_{dr}$ is a symmetric bipolar voltage applied to the primary winding $N_p$ 406, of the isolation transformer, $T_3$. Transformer $T_3$ consists of 2 windings (406, 408,), 1 primary winding (406) with $N_p$ turns and one secondary windings 408 with $N_s$ turns as shown in FIG. 4B. A charge pump formed by diode $D_1$ 410 and capacitor $C_1$ 404 rectifies the secondary voltage and generates a level shifted square wave voltage $v_1$. The turns ratio of the transformer $T_3$ is set to achieve $V_{ON}+V_{OFF}$ VON+ VOFF as the peak of voltage $v_1$. BJT 418 $Q_3$, resistor $R_3$ 416 and BJT 420 $Q_4$, resistor $R_4$ 414 represent a complementary source follower to source and sink the required current in and out of the gate terminal of $Q_{DUT}$ for turn-on and turn-off respectively. Capacitor $C_{zn}$ 424, zener diode $D_{zn}$ 422 forms another charge pump. The zener voltage of $D_{zn}$ is chosen to subtract $V_{OFF}$ from the peak of $v_1$ V1 and apply it to the gate of $Q_{DUT}$ to turn off the device. Neglecting diode forward voltage drops, the voltage $v_{gs}$ applied to the gate of $Q_{DUT}$ has the required turn-on and turn-off levels (with the various wave forms illustrating positive (+) and negative (−) voltages in FIG. 4B).

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to "one embodiment" or "an embodiment" means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment.

Various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the foregoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A gate drive circuit for generating asymmetric drive voltages, the gate drive circuit comprising;
   a gate drive transformer comprising:
      a primary winding responsive to a pulse width modulated (PWM) input signal; and
      a first secondary winding and a second secondary winding responsive to a PWM output signal of the primary winding, the first secondary winding including a first turn ratio different from a second turn ratio of the second secondary winding, the first secondary winding producing a first bias voltage and the second secondary winding producing a second bias voltage;
   a first additional winding electrically coupled to the first secondary winding, and a second additional winding electrically coupled to the second secondary winding, wherein the first additional winding is responsive to the first bias voltage, and the second additional winding is responsive to the second bias voltage;
   a first drive transistor electrically coupled to the first additional winding and responsive to the first bias voltage, and a second drive transistor electrically coupled to the second additional winding and responsive to the second bias voltage; and
   a gate switching device electrically coupled to the first and second drive transistors, wherein, in response to the first bias voltage, the first drive transistor drives the gate switching device to turn on the gate switching device, and wherein, in response to the second bias voltage, the second drive transistor drives the gate switching device to turn off the gate switching device.

2. The gate drive circuit of claim 1, wherein the PWM input signal is a symmetric bipolar square wave voltage and the gate switching device is at least one of a gate MOSFET or an insulated gate bipolar transistors (IGBTs).

3. The gate drive circuit of claim 1, wherein the first bias voltage comprises a voltage of at least twenty (20) volts.

4. The gate drive circuit of claim 1, wherein the second bias voltage comprises at least a voltage of negative five (−5) volts.

5. The gate drive circuit of claim 1, wherein the gate switching device is a silicon carbide MOSFET.

* * * * *